(12) United States Patent
Ueda et al.

(10) Patent No.: US 6,372,981 B1
(45) Date of Patent: Apr. 16, 2002

(54) SEMICONDUCTOR SUBSTRATE, SOLAR CELL USING SAME, AND FABRICATION METHODS THEREOF

(75) Inventors: Takashi Ueda; Chouho Yamagishi, both of Tokyo; Osamu Goto, Miyagi, all of (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/635,125

(22) Filed: Aug. 8, 2000

(30) Foreign Application Priority Data

Aug. 13, 1999 (JP) ............................................. 11-229345
Jun. 27, 2000 (JP) ........................................ 2000-192583

(51) Int. Cl.$^7$ ........................ H01L 31/04; H01L 21/20
(52) U.S. Cl. ..................... 136/261; 136/262; 136/252; 136/255; 257/184; 257/190; 257/200; 257/627; 257/466; 257/431; 257/461; 117/101; 117/902; 438/57; 438/93; 438/94; 438/933; 438/483; 427/585; 427/74
(58) Field of Search ................................. 136/261, 262, 136/252, 255; 257/184, 190, 200, 627, 466, 431, 461; 117/101, 902; 438/57, 93, 94, 933, 483; 427/585, 74

(56) References Cited

U.S. PATENT DOCUMENTS 5,081,519 A * 1/1992 Nishimura .................. 257/200
5,833,749 A * 11/1998 Moritani et al. ............ 117/101

FOREIGN PATENT DOCUMENTS

JP          5-343321        * 12/1993

OTHER PUBLICATIONS

Akiyama et al, "Growth of High Quality GaAs Layers on Si Substrates by MOCVD," Journal of Crystal Growth, 77, pp. 490–497, 1986.*
Akiyama, "Research Into Heteroepitaxial Growth of GaAs on Si Substrates by Metal–Organic Vapor–Phase Deposition," Feb. 1991, pp. 55–77.*
Goto et al, "Improvement in Photovoltaic Conversion Efficiency of InGaP Solar Cells Grown on Si substrate by Thermal Cleaning using Si2H6," Solar Energy & Solar Cells, 66, pp. 631–636, 2001.*
Akiyama "Research into heteroepitaxial growth of GaAs on Si substrates by metal–organic vapor–phase deposition" Feb. 1991, pp. 51–77.
Akiyama et al. "Growth of High Quality GaAs Layers on Si Substrates by MOCVD," Journal of Crystal Growth, vol. 77, 1986, pp. 490–497.

* cited by examiner

Primary Examiner—Alan Diamond
(74) Attorney, Agent, or Firm—Venable; Robert J. Frank; Ashley J. Wells

(57) ABSTRACT

A group-IV semiconductor substrate has an inclined front surface, the inclination being toward a direction differing from the <010>crystal lattice direction. The substrate is cleansed by heating in the presence of a gas including a compound of the group-IV substrate element. A source gas of a group-III element is then supplied, forming an atomic film of the group-III element on the substrate surface. Starting at the same time, or shortly afterward, a source gas of a group-V element is supplied, and a III-V compound semiconductor hetero-epitaxial layer is grown. Chemical bonding of the group-III element to the group-IV substrate surface produces a crystal alignment of the hetero-epitaxial layer that leads to improved conversion efficiency when the semiconductor substrate is used in the fabrication of solar cells with compound semiconductor base and emitter layers.

32 Claims, 6 Drawing Sheets

SEMICONDUCTOR SUBSTRATE, SOLAR CELL USING SAME, AND FABRICATION METHODS THEREOF

BACKGROUND OF THE INVENTION

1. Field of the Invention

The present invention relates to a semiconductor substrate having a hetero-epitaxial layer, a solar cell using this semiconductor substrate, and methods of fabricating the semiconductor substrate and solar cell.

2. Description of the Related Art

Hetero-structure semiconductor devices are being studied for use as high-performance solar cells in spacecraft, to mention just one application. The goal of current research in this area is to develop solar cells with very high conversion efficiency, combined with light weight, high mechanical strength, and low cost. One promising approach grows compound semiconductor layers epitaxially on, for example, a silicon substrate. Silicon provides the requisite high mechanical strength, and is lightweight and low in cost. The compound semiconductor layers provide a higher conversion efficiency than is obtainable from silicon alone.

One compound semiconductor material that provides particularly high conversion efficiency is indium gallium phosphide (InGaP). To grow InGaP on a silicon substrate, however, it is first necessary to add a buffer layer such as a hetero-epitaxial layer of gallium arsenide (GaAs) to the substrate, forming a gallium-arsenide/silicon (GaAs/Si) semiconductor substrate.

A basic problem in the fabrication of this substrate is that of growing a high-quality GaAs hetero-epitaxial layer on a silicon substrate layer. This problem was addressed by M. Akiyama in a thesis published in 1991. His solution was a three-step process comprising a high-temperature surface-cleansing step followed by two epitaxial growth steps, the first growth step being performed at a comparatively low temperature. In the high-temperature surface-cleansing step, arsine gas is used to prevent surface contamination, and hydrogen is used as a carrier gas.

This thesis also reported that it was advantageous to use a silicon substrate cut from a silicon crystal ingot at an angle of, for example, 0.5° to 15° with respect to the (100) crystal lattice plane. The GaAs hetero-epitaxial layer acquires a similar inclination. This inclination is oriented in, for example, the <011> direction of the silicon crystal lattice, and the <0-11> direction of the GaAs crystal lattice. The reason for this particular combination of orientations is that during epitaxial growth, arsenic atoms bind first to the silicon surface.

When solar cells are fabricated by growing InGaP layers on a semiconductor substrate with a GaAs buffer layer formed in this way, however, the conversion efficiency is not as high as expected. It is known that the <0-11> inclination of the GaAs hetero-epitaxial layer promotes an ordering of the InGaP layers, and this is thought to be one reason for the unexpectedly low conversion efficiency, the ordering leading to reduced carrier mobility. It is also known that the ordering of the InGaP layer can be suppressed if the inclination of the GaAs buffer layer is aligned in the <011> direction of the GaAs crystal lattice, which is oriented at right angles to the <0-11> direction, and it is suggested in the above-mentioned thesis that the desired alignment might be achieved if pure hydrogen gas, instead of a mixture of arsine and hydrogen, were to be used in the initial high-temperature surface cleansing step. Unfortunately, hydrogen gas by itself is incapable of preventing surface contamination of the silicon substrate, leading to poorly formed GaAs layers.

An alternative method of preventing contamination is to clean the epitaxial growth apparatus each time it is used, but this method is unattractive because it lowers production efficiency and raises fabrication costs.

An object of the present invention is to provide a semiconductor substrate having a group-IV semiconductor layer and a group-III-V compound semiconductor hetero-epitaxial layer, in which the surface of the group-III-V compound semiconductor hetero-epitaxial layer is of high quality and is inclined in the <011> crystal lattice direction.

Another object of the invention is to provide a solar cell with improved conversion efficiency.

SUMMARY OF THE INVENTION

The invented semiconductor substrate comprises a group-IV semiconductor substrate layer and a group-III-V compound semiconductor hetero-epitaxial layer. The group-IV semiconductor substrate layer is cut from a group-IV semiconductor ingot at an angle such that its front surface is inclined with respect to the (100) crystal lattice plane in a direction differing from the <010> crystal lattice direction. The group-III-V compound semiconductor hetero-epitaxial layer is grown on the inclined front surface of the group-IV semiconductor substrate layer. The <011> crystal lattice direction of the group-III-V compound semiconductor hetero-epitaxial layer is substantially aligned with the direction of inclination of the front surface.

The group-IV semiconductor substrate layer comprises, for example, silicon or germanium. The group-III-V compound semiconductor hetero-epitaxial layer comprises, for example, gallium arsenide or indium phosphide.

The invented fabrication method for the invented semiconductor substrate includes the steps of:

(a) obtaining a group-IV semiconductor substrate layer cut from an ingot at an angle as described above;

(b) heating the substrate in the presence of a gas including a compound of a group-IV element present in the substrate layer, to clean the substrate layer;

(c) supplying a source gas of a group-III element, thereby forming an atomic film of the group-III element on the surface of the substrate layer; and (d) supplying a source gas of a group-V element together with the source gas of the group-III element, thereby growing a group-III-V compound semiconductor hetero-epitaxial layer on the substrate layer.

The gas used in step (b) is preferably a hydrogen or halogen compound of the group-IV element. The use of this gas for cleansing permits atoms of the group-III element to bind chemically with the substrate surface in step (c), which in turn produces the desired alignment of the crystal lattice directions of the hetero-epitaxial layer. This cleansing process also effectively protects the surface of the group-IV substrate layer from contamination, producing a high surface quality that carries over to the surface of the group-III-V compound semiconductor hetero-epitaxial layer.

Supply of the two source gases used in steps (c) and (d) may begin simultaneously, or the supply of the source gas for the group-V element may begin after the source gas for the group-III element is already being supplied.

The invented solar cell comprises the invented semiconductor substrate, a compound semiconductor base layer, and a compound semiconductor emitter layer. The compound semiconductor base layer and emitter layer comprise, for example, indium gallium phosphide.

The invented method of fabricating a solar cell comprises the steps (a) to (d) described above, followed by the formation of the base layer and the emitter layer.

The alignment of the <011> crystal lattice direction of the group-III-V compound semiconductor hetero-epitaxial layer in the-general direction of surface inclination reduces ordering in the compound semiconductor base layer and emitter layer, thereby enhancing the conversion efficiency of the solar cell.

DETAILED DESCRIPTION OF THE INVENTION

Figure 1:
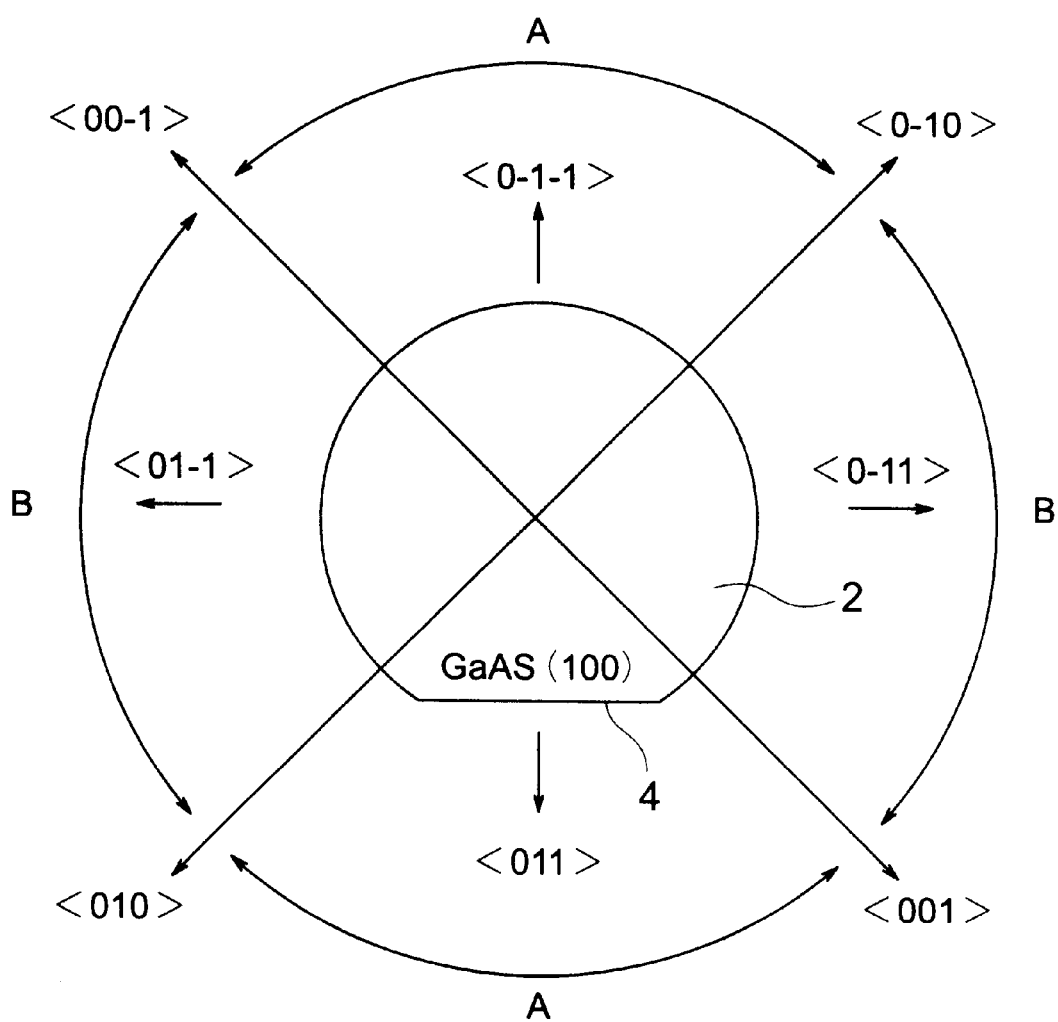
FIG. 1 illustrates crystal lattice directions in a conventional GaAs wafer.

A GaAs/Si semiconductor substrate embodying the invention, and a method of fabricating the substrate, will be described with reference to the attached drawings, in which like parts are indicated by like reference numerals. The description of this embodiment will be followed by a comparison with the prior art, then by a description of a solar cell embodying the invention and a method of fabricating the solar cell.

A group-III-V compound semiconductor layer will be referred to simply as a III-V compound semiconductor layer.

For reference, FIG. 1 shows various crystal lattice directions in a conventional GaAs wafer 2 cut substantially parallel to the (100) crystal lattice plane. The wafer has an orientation flat 4 indicating the <011> crystal lattice direction. The opposite direction is designated <0-1-1>, but the <011> and <0-1-1> directions are crystallographically equivalent, and will both be referred to herein as the <011> crystal lattice direction.

Similarly, the <01-1> and <0-11> crystal lattice directions, which are oriented at right angles to the <011> direction, will both be referred to herein as the <0-11> crystal lattice direction.

The <010>, <001>, <0-10>, <00-1>, <100>, and <-100> crystal lattice directions are also crystallographically equivalent, and will be collectively referred to herein as the <010> crystal lattice directions.

The <010> crystal lattice directions divide the (100) crystal lattice plane into four quadrants, of which the two quadrants marked A are centered around the <011> crystal lattice direction, and the two quadrants marked B are centered around the <0-11> crystal lattice direction. If the wafer surface is inclined with respect to the (100) plane, a vector normal to the surface, as seen from above, appears to extend into one of these four quadrants. The <011> crystal lattice direction will be said to be substantially aligned with the direction of inclination of the surface if the vector extends into one of the quadrants marked A.

A silicon wafer has similar crystal lattice directions. In a silicon wafer, the <011>, <0-11>, <01-1>, and <0-1-1> directions are all crystallographically equivalent, and all will be referred to as the <011> crystal lattice direction.

As a first embodiment of the invention, a method of fabricating a GaAs/Si semiconductor substrate of the invented type will now be described.

Figure 2A:
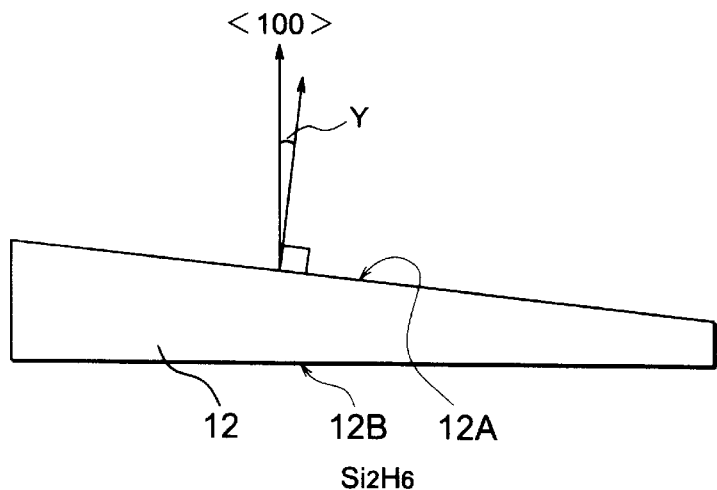
FIGS. 2A, 2B, 2C, and 2D are sectional views illustrating steps in the fabrication of a GaAs/Si semiconductor substrate of the invented type.

Referring to FIG. 2A, the fabrication process starts from a silicon substrate layer 12, which is a silicon wafer that has been cut from a monocrystalline silicon ingot at an angle Y with respect to a crystal lattice plane defined as the (100) plane. The direction normal to the (100) crystal lattice plane is the <100> crystal lattice direction indicated in the drawing. The direction of inclination of the front surface 12A of the substrate may be any direction other than one of the four <010> crystal lattice directions. In the description below, it will be assumed that the <011> crystal lattice direction is substantially aligned with the direction of inclination of the front surface 12A, but the alignment need not be exact.

The angle Y of inclination should be within the general range from about 0.5° to 15°. It will be assumed below that the angle Y is equal to 3°, although a larger angle is shown in the drawings for clarity. Because of the inclination, on an atomic scale, the front surface 12A of the substrate layer 12 has a staircase configuration comprising a series of flat steps with surfaces parallel to the (100) crystal lattice plane. The steps are only a few atomic layers high at most, so the surface appears smooth and flat, and the steps are not shown in the drawings.

To indicate the inclination of the front surface 12A, the back surface 12B of the substrate layer 12 is shown as if it were parallel to the (100) crystal lattice plane, but this is a convention adopted purely for explanatory purposes.

The back surface 12B is actually cut parallel to the front surface 12A, at the same angle Y to the (100) crystal lattice plane. The substrate layer 12 has a substantially uniform thickness of three hundred fifty micrometers (350 $\mu$m).

A GaAs buffer layer is formed on this substrate layer 12 by metal-organic chemical vapor deposition (MOCVD). The substrate layer 12 is placed on a wafer carrier in a reaction chamber, with the front surface 12A facing upward. (The wafer carrier and reaction chamber are not shown in the drawings.) The reaction chamber is initially at room temperature, but during the fabrication process, the substrate layer 12 is heated by resistive heating. While the substrate layer 12 is being heated, the wafer carrier and substrate layer are rotated at a constant rate, to ensure that gases that will be introduced into the reaction chamber reach the front surface 12A uniformly.

Figure 2B:
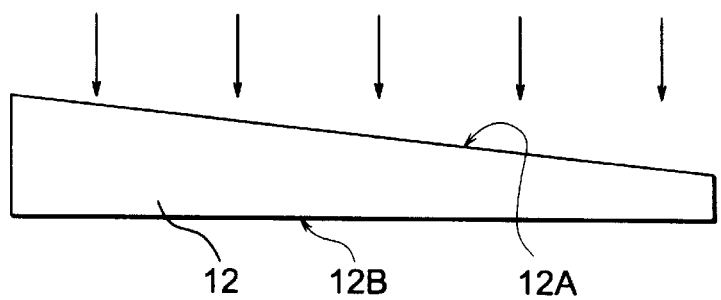

Referring to FIG. 2B, when the temperature of the silicon substrate layer 12 reaches approximately 450° C., two hundred standard cubic centimeters per minute (200 sccm) of disilane gas ($Si_2H_6$) diluted in hydrogen are supplied to the reaction chamber. The dilution ratio is twenty parts per million (20 ppm). Heating continues until the temperature of the silicon substrate layer 12 is 950° C.; then the temperature is held constant at 950° C. for a time T, equal to five minutes, for example, to clean the front surface 12A.

This high-temperature cleansing step removes the natural oxide that forms on the surface of the silicon substrate layer 12, and removes any impurities that might be contaminating the surface. The purpose of the silane gas is to prevent recontamination of the front surface 12A by substances released from the wafer carrier, susceptor, and other structures in the reaction chamber, including the walls of the reaction chamber. Such potential contaminants are typically left by the processing of previous wafers.

The surface-cleaning step is not limited to the use of disilane. Another compound of silicon and hydrogen, such as silane ($SiH_4$), or a compound of silicon and a halogen element, such as silicon tetrachloride ($SiCl_4$), may be used instead. The essential requirement is that the compound include the substrate element, in this case silicon.

Figure 2C:
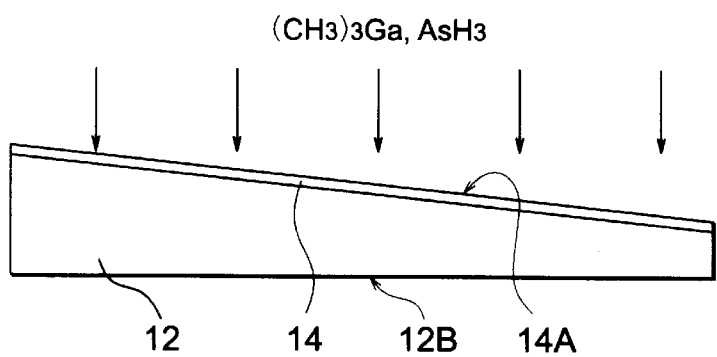

Referring to FIG. 2C, after the surface cleansing step, the temperature of the silicon substrate 12 is reduced to 450° C. When this temperature is reached, the supply of disilane gas is stopped, and source gases for a group-III element and a group-V element are supplied to the reaction chamber. First, trimethyl-gallium (($CH_3)_3Ga$), which is a source gas for the group-III element gallium, is supplied. Starting shortly thereafter, arsine ($AsH_3$), which is a source gas for the group-V element arsenic, is also supplied.

The source gases react with the surface of the substrate layer to form a low-temperature GaAs buffer layer 14 on the front surface 12A by hetero-epitaxial growth. First, gallium atoms, made available by the thermal decomposition of trimethyl-gallium, form chemical bonds with the silicon atoms at the front surface 12A, creating an atomic film of gallium on the substrate surface. Arsenic atoms, made available by the thermal decomposition of arsine, then bind to the gallium atoms, forming an atomic film of arsenic. Gallium and arsenic atomic films continue to form in turn, creating a uniform crystal structure aligned with the crystal structure of the silicon substrate 12. Specifically, the (100) plane of the GaAs crystal lattice forms parallel to the (100) plane of the silicon crystal lattice, and the <011> direction of the GaAs crystal lattice is aligned with the <011> direction of the silicon crystal lattice, thus substantially aligned with the direction of inclination of the front surface 12A of the silicon substrate layer 12. The reason why the <011> direction of the GaAs crystal lattice becomes aligned in this direction is thought to be the chemical binding of the group-III element (gallium) to the group-IV element (silicon) at the surface of the substrate layer.

The low-temperature GaAs buffer layer 14 grows with a substantially uniform thickness, so its front surface 14A acquires the same inclination as the surface of the silicon substrate layer 12. The surface 14A of the low-temperature GaAs buffer layer 14 is accordingly inclined in the <011> crystal lattice direction.

It is not necessary for the supply of trimethyl-gallium gas to begin before the supply of arsine. Gallium atoms will bind to the substrate surface even if the supply of both source gases begins simultaneously, because when the substrate temperature is 450° C., trimethyl-gallium decomposes more quickly than arsine. Arsine should not be supplied before trimethyl-gallium, however.

When the low-temperature GaAs buffer layer 14 has reached a desired thickness, in the range from one hundred to two hundred angstroms (100 Å to 200 Å), the supply of trimethyl-gallium is suspended, while the supply of arsine continues. The temperature of the silicon substrate 12 is now raised to 700° C.

Figure 2D:
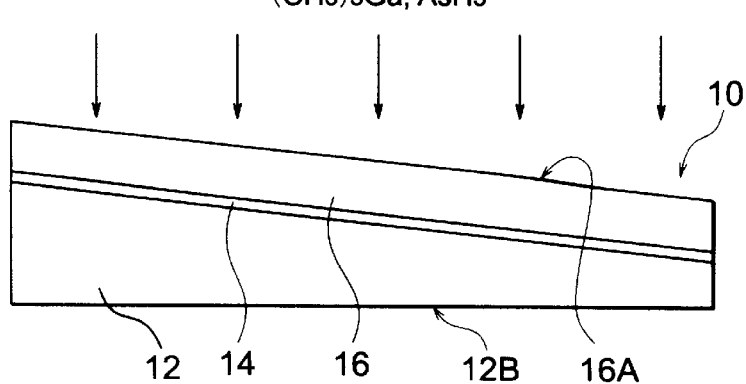

Referring to FIG. 2D, when the substrate temperature reaches 700° C., the supply of trimethyl-gallium is resumed, while the supply of arsine continues, and a normal-temperature GaAs epitaxial layer 16 is grown on the surface of the low-temperature GaAs buffer layer 14. This GaAs layer 16 also grows with a substantially uniform thickness, so its front surface 16A also has the same inclination as the surface of the silicon substrate layer 12. The two GaAs buffer layers 14, 16 are physically continuous and share the same crystal structure. The (100) crystal lattice plane of the normal-temperature GaAs buffer layer 16 thus forms parallel to the (100) crystal lattice plane of the silicon substrate layer 12, and the <011> lattice direction of this GaAs buffer layer 16 is aligned with the <011> direction of the silicon substrate layer 12.

Trimethyl-gallium and arsine continue to be supplied at 700° C. until the GaAs layer 16 has grown to the desired thickness, at which point the supply of trimethyl-gallium is stopped and the substrate temperature is reduced.

Hydrogen ($H_2$) is used as a carrier gas in the surface cleansing step (FIG. 2B), the step of forming the low-temperature GaAs buffer layer 14 (FIG. 2C), and the step of forming the normal-temperature GaAs buffer layer 16 (FIG. 2D). The flow rate of the carrier gas is seven standard liters per minute (7 slm).

Figure 3:
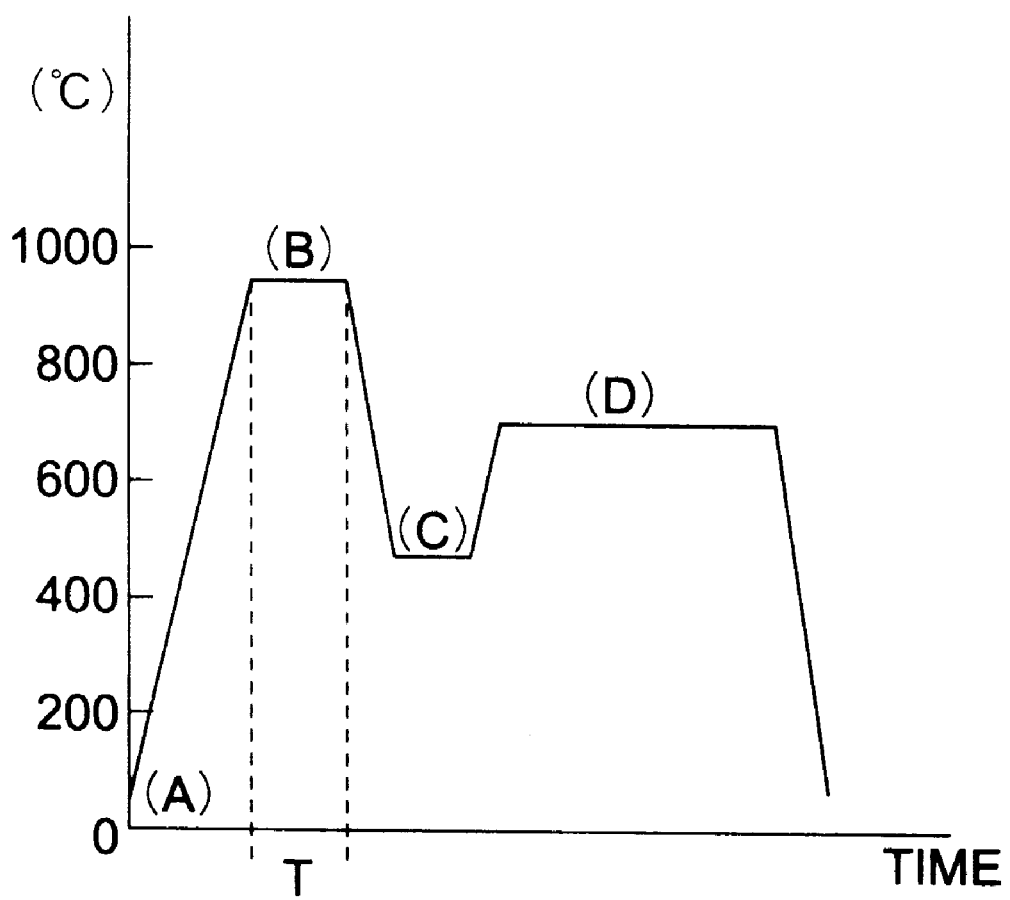
FIG. 3 is a graph indicating the substrate temperature during the above fabrication process.

FIG. 3 summarizes the temperature control scheme for the entire fabrication process, temperature being indicated on the vertical axis and time on the horizontal axis. Disilane gas is supplied while the wafer is being heated from room temperature (A) to 950° C. and held at 950° C. (B) for surface cleansing. Trimethyl-gallium and arsine gases are supplied while the low-temperature GaAs buffer layer 14 is formed at 450° C. (C) and while the GaAs layer 16 is formed at 700° C. (D).

The fabrication process described above produces hetero-epitaxial GaAs buffer layers 14, 16 with a good surface morphology, having a low density of surface defects.

The fabrication process is not limited to the temperatures stated above, but the cleansing step (B) should be performed at a temperature of at least 900° C. The low-temperature epitaxial growth step (C) should be performed at a temperature in the range from 400° C. to 450° C.

The fabrication process is not limited to the materials described above. For example, triethyl-gallium (($C_2H_3)_3Ga$) may be used instead of trimethyl-gallium (($CH_3)_3Ga$) as a source gas for the group-III element gallium.

The compound semiconductor buffer layers 14, 16 need not be GaAs layers, but may comprise another III-V compound semiconductor material, such as aluminum gallium arsenide (AlGaAs), having arsenic as a group-V element. Alternatively, the buffer layers 14, 16 may comprise a III-V compound semiconductor material, such as indium phosphide (InP) or gallium phosphide (GaP), having phosphorus as a group-V element.

The group-IV substrate layer may be a germanium (Ge) substrate layer instead of a silicon substrate layer. Silicon has the above-mentioned advantages of high mechanical strength, light weight, and low cost, but germanium also has the advantages of high mechanical strength and low cost, as compared with a compound semiconductor substrate such as a GaAs substrate.

In all of these variations, the group-IV substrate still has a front surface inclined with respect to the (100) crystal lattice plane. In the hetero-epitaxial growth process, the source gas of the group-V element is introduced slightly after, or simultaneously with, but not before, the source gas of the group-III element or elements, so that atoms of a group-III element bind to the front surface of the group-IV layer.

Next, the fabrication method described above will be compared with the conventional fabrication method of a GaAs/Si semiconductor substrate, described in the above-mentioned thesis.

Figure 4A:
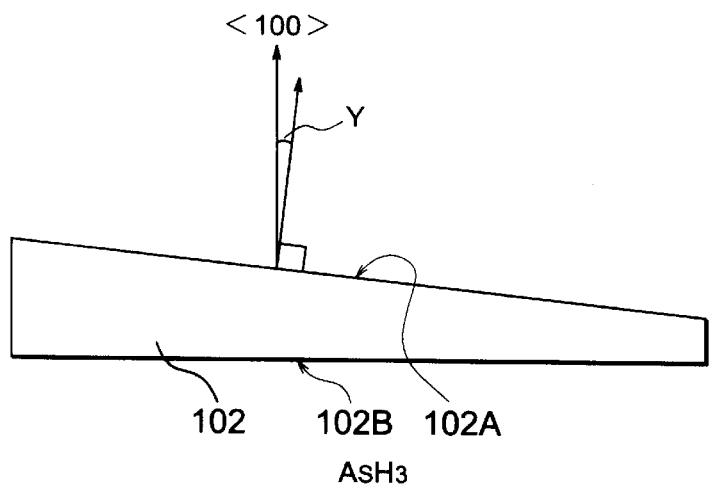
FIGS. 4A, 4B, 4C, and 4D are sectional views illustrating steps in the fabrication of a conventional GaAs/Si semiconductor substrate.

Referring to FIG. 4A, the conventional method also starts from a silicon substrate layer 102 having an inclined front surface 102A. The front surface 102A is oriented as described above, being inclined with respect to the (100) crystal lattice plane in a direction differing from the <010> crystal lattice direction.

Figure 4B:
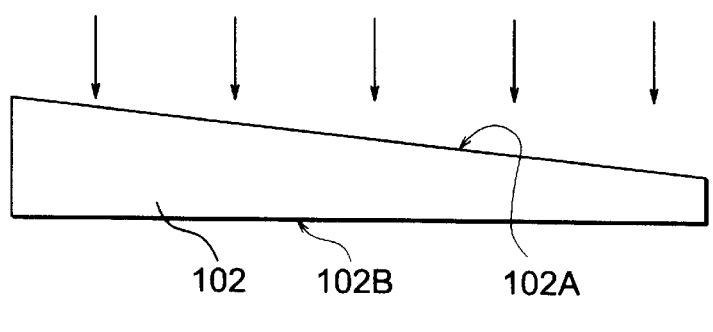

Referring to FIG. 4B, in the conventional fabrication process, arsine ($AsH_3$) is supplied in a hydrogen ($H_2$) carrier gas during the surface-cleansing step, while the substrate layer 102 is raised to a temperature of at least 900° C. and held at that temperature for about five minutes. Arsine protects the substrate layer 102 from recontamination. The supply of arsine and hydrogen gases continues while the temperature is reduced to the range from 400° C. to 450° C.

Figure 4C:
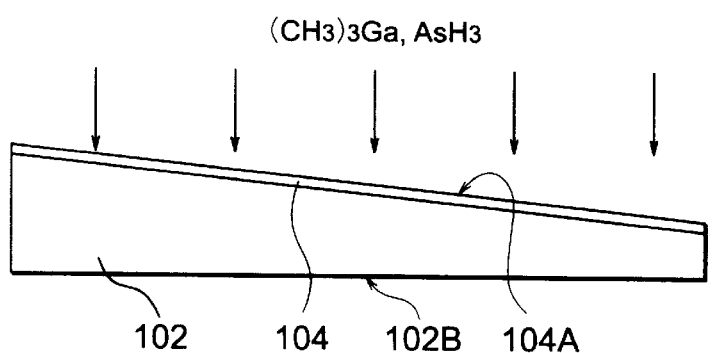

Referring to FIG. 4C, trimethyl-gallium (($CH_3)_3Ga$) and arsine are now supplied in a hydrogen carrier gas to grow a low-temperature GaAs buffer layer 104, as in the invented process. The front surface 104A of the low-temperature GaAs buffer layer 104 grows parallel to the surface of the silicon substrate layer 102, as in the invented process, but the crystal lattice is rotated through ninety degrees in the (100) plane; the <0-11> direction of the low-temperature GaAs buffer layer 104 now coincides with the <011> direction of the silicon substrate layer 102, and is substantially aligned with the direction of inclination of the front surface of the silicon substrate layer 102 and the front surface 104A of the low-temperature GaAs buffer layer 104. The reason is thought to be that arsenic atoms freed by thermal decomposition of the arsine gas that was supplied during the preceding cleansing step bind with the silicon surface.

Figure 4D:
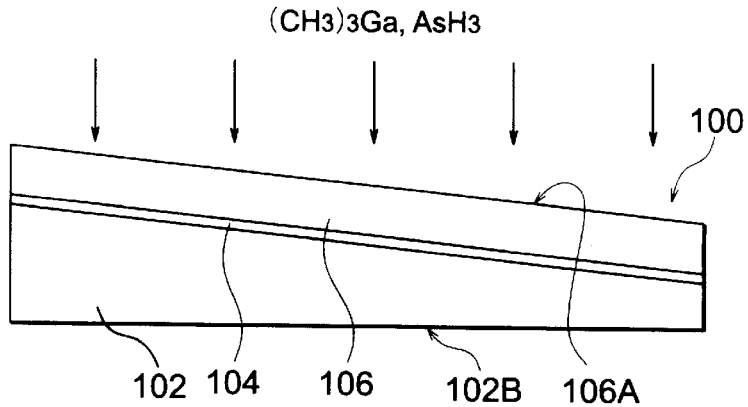

Referring to FIG. 4D, the supply of trimethyl-gallium gas is stopped while the substrate temperature is raised to 700° C., then resumed to grow a GaAs buffer layer 106 at this temperature. This GaAs buffer layer 106 forms a continuation of the crystal lattice of the low-temperature GaAs buffer layer 104, its upper surface 106A growing parallel to the front surface of the silicon substrate layer 102, and being inclined substantially in the <0-11> direction of the GaAs crystal lattice.

When the conventional arsine gas is used in the surface-cleansing step, it is impossible to grow a hetero-epitaxial GaAs buffer layer in which the <011> crystal lattice direction is aligned even approximately with the direction of surface inclination. If the arsine is eliminated and only hydrogen is used in the surface-cleansing step, however, then keeping the surface clean becomes difficult, and a GaAs/Si semiconductor substrate with a poor surface morphology is obtained.

Next, as a second embodiment of the invention, a solar cell fabricated using the invented semiconductor substrate will be described. The inventors have fabricated this solar cell by MOCVD, using trimethyl-gallium (($CH_3)_3Ga$), trimethyl-aluminum (($CH_3)_3Al$), trimethyl-indium (($CH_3)_3In$), phosphine ($PH_3$), and arsine ($AsH_3$) as source gases, with hydrogen ($H_2$) as a carrier gas at a reduced pressure of one hundred Torricellis (100 Torr). Doping was carried out by using disilane ($Si_2H_6$) as an n-type dopant, and dimethyl-zinc (($CH_3)_2Zn$) as a p-type dopant. Disilane was also used for high-temperature cleansing.

Figure 5:
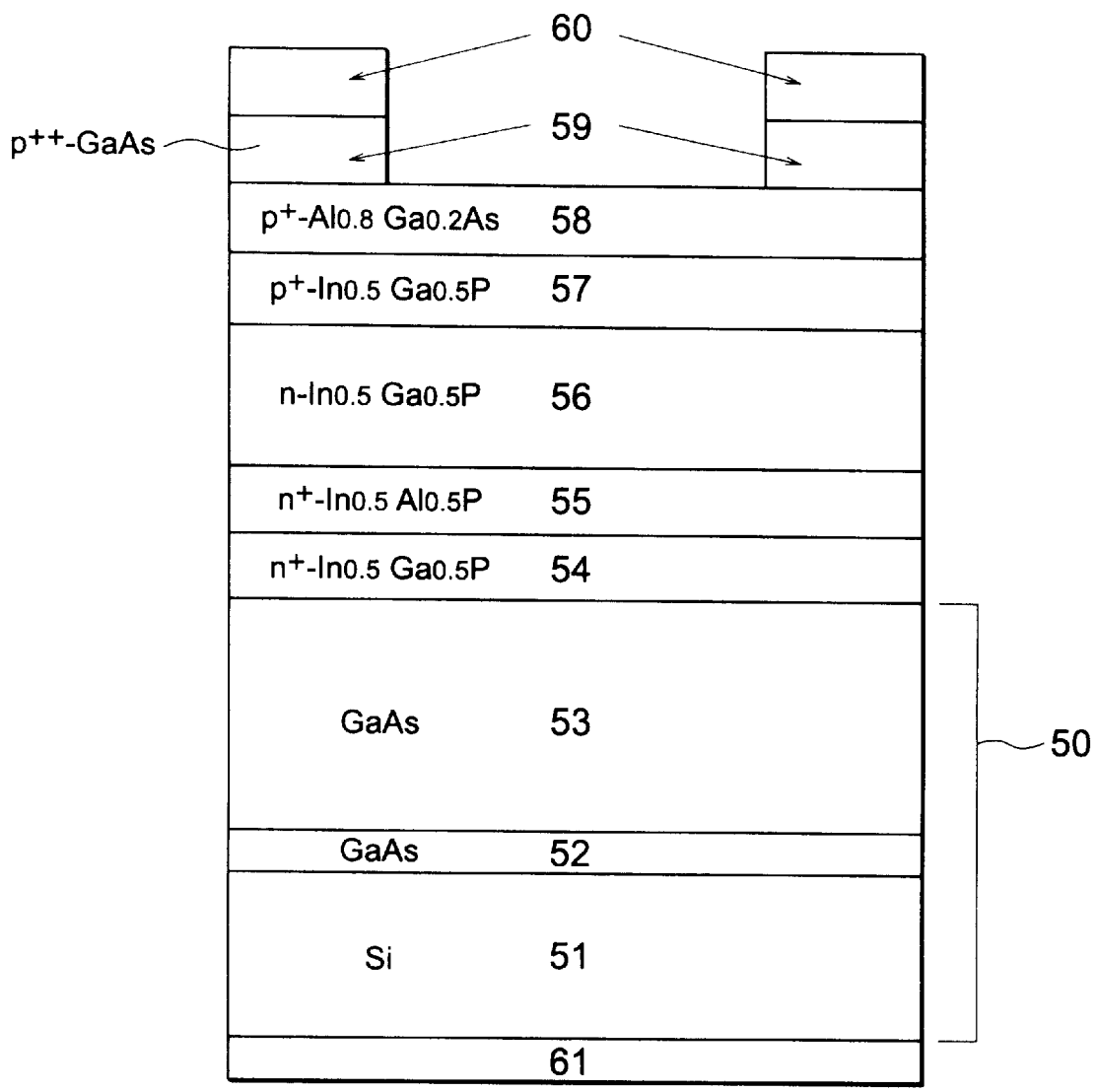
FIG. 5 is a sectional view of a solar cell of the invented type.

Referring to FIG. 5, the fabrication process starts with the formation of a GaAs/Si semiconductor substrate 50 as described in the first embodiment. An n-type silicon substrate layer 51 is cleansed as described in the first embodiment, and an $n^+$-type low-temperature GaAs buffer layer 52 with a thickness of ten nanometers (10 nm) is grown on the substrate layer 51 by MOCVD, using trimethyl-gallium and arsine as source gases. This buffer layer 52 becomes an $n^+$-type layer by diffusion doping from the underlying $n^+$-type silicon substrate layer 51. An $n^+$-type normal-temperature GaAs buffer layer 53 with a thickness of two micrometers (2 $\mu$m) is grown on the $n^+$-type low-temperature GaAs buffer layer 52 by MOCVD, using trimethyl-gallium and arsine as source gases and disilane as an n-type dopant.

The substrate layer 51 and the buffer layers 52, 53 correspond to the substrate layer 12 and buffer layers 14, 16 in the first embodiment. They are fabricated in the same way, and have the same surface inclination and crystal alignments.

Next, an $n^+$-type $In_{0.5}Ga_{0.5}P$ buffer layer 54 two hundred nanometers (200 nm) thick is grown, using trimethyl-gallium, trimethyl-indium, and phosphine as source gases and disilane as an n-type dopant. This is followed by the formation of an $n^+$-type indium aluminum phosphide ($In_{0.5}Al_{0.5}P$) back surface field (BSF) layer 55 thirty nanometers (30 nm) thick, using trimethyl-gallium, trimethyl-aluminum, and phosphine as source gases, and disilane as an n-type dopant.

Next, an n-type $In_{0.5}Ga_{0.5}P$ base layer 56 seven hundred nanometers (700 nm) thick is formed, using trimethyl-gallium, trimethyl-indium, and phosphine as source gases, and disilane as an n-type dopant. This is followed by the formation of a $p^+$-type $In_{0.5}Ga_{0.5}P$ emitter layer 57 fifty-five nanometers (55 nm) thick, using trimethyl-gallium, trimethyl-indium, and phosphine as source gases, and dimethyl-zinc as a p-type dopant.

Next, a $p^+$-type aluminum gallium arsenide ($Al_{0.8}Ga_{0.2}As$) window layer 58 thirty nanometers (30 nm) thick is formed, using trimethyl-gallium, trimethyl-aluminum, and arsine as source gases, and dimethyl-zinc as a p-type dopant. Following this, a $p^{++}$-type GaAs contact layer 59 one hundred nanometers (100 nm) thick is formed, using trimethyl-gallium (($CH_3)_3Ga$) and arsine ($AsH_3$) as source gases, and dimethyl-zinc (($CH_3)_2Zn$) as a p-type dopant.

All of these additional layers 54, 55, 56, 57, 58, 59 are grown as crystalline layers, using a hydrogen carrier gas.

Next, a p-type ohmic electrode 60 is formed as a front surface electrode. The p-type ohmic electrode 60 is formed by successive deposition of films of titanium (Ti), platinum (Pt), and gold (Au), which are patterned by photolithography, using the lift-off method. Unnecessary parts of the $p^{++}$-type GaAs contact layer 59 are then removed by etching, using the p-type ohmic electrode 60 as a mask. Finally, an n-type ohmic electrode 61 is formed as a back surface electrode on the underside of the substrate 50. The n-type ohmic electrode 61 is formed by vacuum evaporation of films of a gold-germanium (AuGe) alloy, nickel (Ni), and gold (Au), in this order. The cell is then sintered at 400° C. to improve the ohmic contacts. If necessary, an anti-reflection coating (not shown) may also be formed; a detailed description of this coating will be omitted.

The GaAs/Si semiconductor substrate 50 of this solar cell, comprising the silicon substrate layer 51 and GaAs buffer layers 52, 53, is identical to the GaAs/Si semiconductor substrate described in the first embodiment. Ad Use of this substrate 50 reduces ordering in the InGaP layers formed over the upper GaAs buffer layer 53, as compared with use of the conventional substrate fabricated as shown in FIGS. 4A to 4D. That is, use of the invented semiconductor substrate reduces ordering in the n$^+$-type $In_{0.5}Ga_{0.5}P$ buffer layer 54, the n-type $In_{0.5}Ga_{0.5}P$ base layer 56, and the p$^+$-type $In_{0.5}Ga_{0.5}P$ emitter layer 57.

Figure 6:
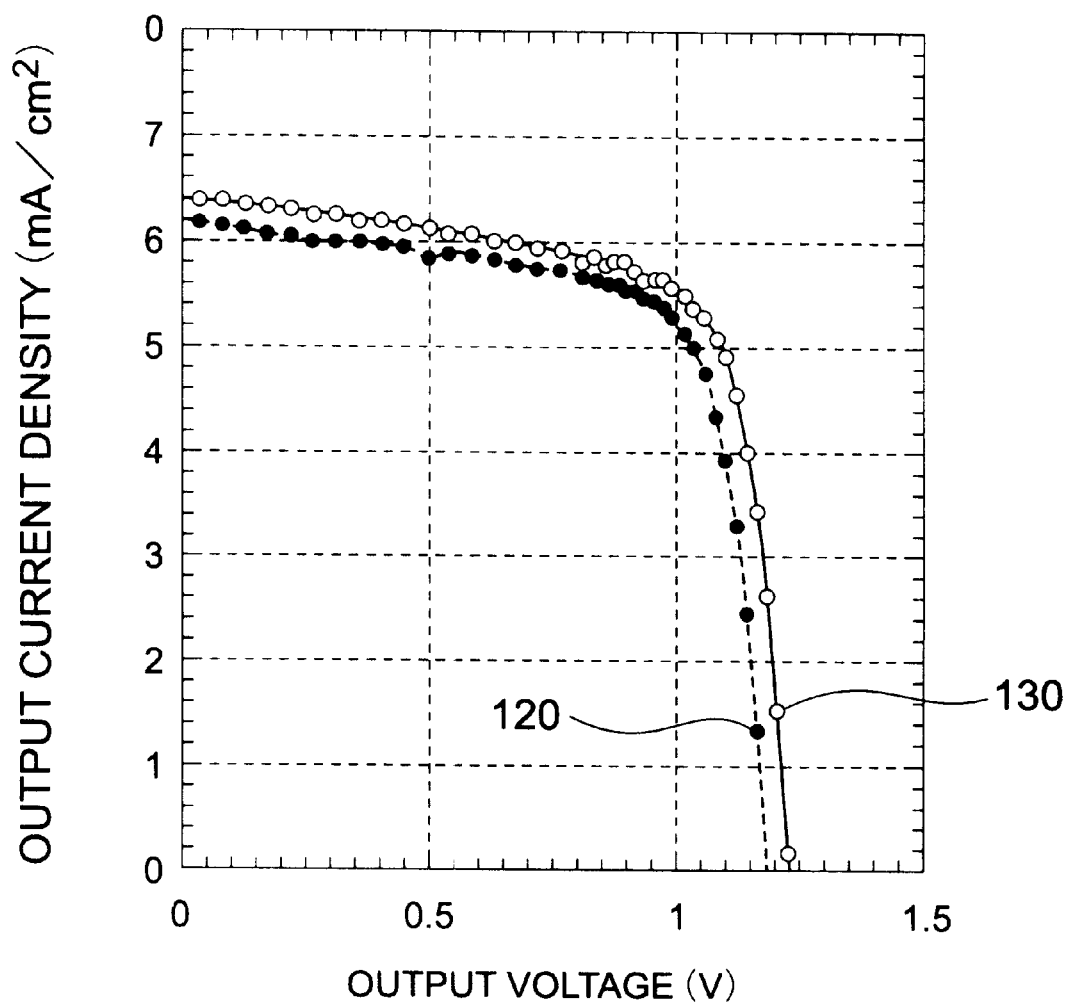
FIG. 6 is a graph illustrating the current-voltage characteristics of solar cells of the invented type and a conventional type.

FIG. 6 shows current-voltage (I-V) characteristics of solar cells fabricated with the conventional substrate (black data points 120) and the invented substrate (white data points 130). Aside from the use of different substrates, the two solar cells had identical structures, both as shown in FIG. 5. Use of the invented substrate increased the short-circuit current and the open-circuit voltage of the cell, and increased the output power at all points on the I-V curve. The conversion efficiency was improved from 5.3% to 5.6%.

It is anticipated that the invented substrate may also improve the conversion efficiency of solar cells using group-III-V semiconductor materials other than InGaP.

A few variations in the preceding embodiments have already been mentioned, but those skilled in the art will recognize that further variations of the invented semiconductor substrate, solar cell, and fabrication methods are possible within the scope claimed below.

What is claimed is:

1. A semiconductor substrate, comprising:
    a group-IV semiconductor substrate layer having a front surface, a (100) crystal lattice plane, and a <010> crystal lattice direction, cut from a group-IV semiconductor ingot at an angle such that the front surface is inclined with respect to the (100) crystal lattice plane in a direction of inclination differing from the <010> crystal lattice direction; and
    a group-III-V compound semiconductor hetero-epitaxial layer grown on the front surface of the group-IV semiconductor substrate layer, having a <011> crystal lattice direction substantially aligned with the direction of inclination of the front surface.

2. The semiconductor substrate of claim 1, wherein the group-IV semiconductor substrate layer comprises silicon.

3. The semiconductor substrate of claim 1, wherein the group-IV semiconductor substrate layer comprises germanium.

4. The semiconductor substrate of claim 1, wherein the group-III-V compound semiconductor hetero-epitaxial layer comprises gallium arsenide.

5. The semiconductor substrate of claim 1, wherein the group-III-V compound semiconductor hetero-epitaxial layer comprises indium phosphide.

6. A method of forming a semiconductor substrate, comprising the steps of:
    (a) obtaining a group-IV semiconductor substrate layer having a front surface, a (100) crystal lattice plane, and a <010> crystal lattice direction, the substrate layer being cut from a group-IV semiconductor ingot at an angle such that the front surface is inclined with respect to the (100) crystal lattice plane in a direction of inclination differing from the <010> crystal lattice direction;
    (b) heating the substrate layer in the presence of a gas including a compound of the group-IV element present in the substrate layer, thereby cleaning the front surface of the substrate layer;
    (c) supplying a first source gas of a group-III element, thereby forming an atomic film of the group-III element on said front surface; and
    (d) supplying a second source gas of a group-V element, together with the first source gas of the group-III element, thereby growing a group-III-V compound semiconductor hetero-epitaxial layer on said front surface.

7. The method of claim 6, wherein the supply of the second source gas of the group-V element in said step (d) begins after the first source gas of the group-III element is already being supplied in said step (c).

8. The method of claim 6, wherein the supply of the second source gas of the group-V element in said step (d) and the supply of the first source gas of the group-III element in said step (c) begin simultaneously.

9. The method of claim 6, wherein the compound of the group-IV element in the gas used in said step (b) is a hydrogen compound of the group-IV element.

10. The method of claim 6, wherein the compound of the group-IV element in the gas used in said step (b) is a halogen compound of the group-IV element.

11. The method of claim 6, wherein said substrate layer is a silicon substrate layer.

12. The method of claim 6, wherein said substrate layer is a germanium substrate layer.

13. The method of claim 6, wherein the group-III-V compound semiconductor hetero-epitaxial layer comprises gallium arsenide.

14. The method of claim 6, wherein the group-III-V compound semiconductor hetero-epitaxial layer comprises indium phosphide.

15. A solar cell having at least a compound semiconductor base layer and a compound semiconductor emitter layer overlying a semiconductor substrate, the semiconductor substrate comprising:
    a group-IV semiconductor substrate layer having a front surface, a (100) crystal lattice plane, and a <010> crystal lattice direction, cut from a group-IV semiconductor ingot at an angle such that the front surface is inclined with respect to the (100) crystal lattice plane in a direction of inclination differing from the <010> crystal lattice direction; and
    a group-III-V compound semiconductor hetero-epitaxial layer grown on the front surface of the group-IV semiconductor substrate layer, having a <011> crystal lattice direction substantially aligned with the direction of inclination of the front surface of the group-IV semiconductor substrate layer.

16. The solar cell of claim 15, wherein the group-IV semiconductor substrate layer comprises silicon.

17. The solar cell of claim 15, wherein the group-IV semiconductor substrate layer comprises germanium.

18. The solar cell of claim 15, wherein the group-III-V compound semiconductor hetero-epitaxial layer comprises gallium arsenide.

19. The solar cell of claim 15,
    wherein the group-III-V compound semiconductor hetero-epitaxial layer comprises indium phosphide.

20. The solar cell of claim 15, wherein the compound semiconductor base layer and the compound semiconductor emitter layer are both group-III-V compound semiconductor layers.

21. The solar cell of claim 20, wherein the compound semiconductor base layer and the compound semiconductor emitter layer both comprise indium gallium phosphide.

22. A method of fabricating a solar cell, comprising the steps of:
    (a) obtaining a group-IV semiconductor substrate layer having a front surface, a (100) crystal lattice plane, and a <010> crystal lattice direction, the substrate layer being cut from a group-IV semiconductor ingot at an angle such that the front surface is inclined with respect to the (100) crystal lattice plane in a direction of inclination differing from the <010> crystal lattice direction;

(b) heating the substrate layer in the presence of a gas including a compound of the group-IV element present in the substrate layer, thereby cleaning the front surface of the substrate layer;

(c) supplying a first source gas of a group-III element, thereby forming an atomic film of the group-III element on said front surface;

(d) supplying a second source gas of a group-V element, together with the first source gas of the group-III element, thereby growing a group-III-V compound semiconductor hetero-epitaxial layer on said front surface; and (e) growing a compound semiconductor base layer and a compound semiconductor emitter layer, one after another, overlying the group-III-V compound semiconductor hetero-epitaxial layer.

23. The method of claim 22, wherein the supply of the second source gas of the group-V element in said step (d) begins after the first source gas of the group-III element is already being supplied in said step (c).

24. The method of claim 22, wherein the supply of the second source gas of the group-V element in said step (d) and the supply of the first source gas of the group-III element in said step (c) begin simultaneously.

25. The method of claim 22, wherein the compound of the group-IV element in the gas supplied in said step (b) is a hydrogen compound of the group-IV element.

26. The method of claim 22, wherein the compound of the group-IV element in the gas supplied in said step (b) is a halogen compound of the group-IV element.

27. The method of claim 22, wherein said substrate layer is a silicon substrate layer.

28. The method of claim 22, wherein said substrate layer is a germanium substrate layer.

29. The method of claim 22, wherein the group-III-V compound semiconductor hetero-epitaxial layer comprises gallium arsenide.

30. The method of claim 22, wherein the group-III-V compound semiconductor hetero-epitaxial layer comprises indium phosphide.

31. The method of claim 22, wherein the compound semiconductor base layer and the compound semiconductor emitter layer are both group-III-V compound semiconductor layers.

32. The method of claim 31, wherein the compound semiconductor base layer and the compound semiconductor emitter layer both comprise indium gallium phosphide.

* * * * *